(12) United States Patent
Hamada et al.

(10) Patent No.: US 12,250,783 B2
(45) Date of Patent: Mar. 11, 2025

(54) CONNECTOR MODULE AND SUBSTRATE STRUCTURE

(71) Applicant: Sumitomo Wiring Systems, Ltd., Yokkaichi (JP)

(72) Inventors: Ryoma Hamada, Yokkaichi (JP); Akihiro Oda, Yokkaichi (JP); Yuya Matsuo, Yokkaichi (JP); Noriko Okamoto, Yokkaichi (JP); Tatsuya Daidoji, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 345 days.

(21) Appl. No.: 17/759,637

(22) PCT Filed: Jan. 19, 2021

(86) PCT No.: PCT/JP2021/001598
§ 371 (c)(1),
(2) Date: Jul. 28, 2022

(87) PCT Pub. No.: WO2021/153324
PCT Pub. Date: Aug. 5, 2021

(65) Prior Publication Data
US 2023/0069880 A1    Mar. 9, 2023

(30) Foreign Application Priority Data

Jan. 30, 2020 (JP) ................................ 2020-014062

(51) Int. Cl.
*H05K 7/06* (2006.01)
*H01R 13/502* (2006.01)
(Continued)

(52) U.S. Cl.
CPC ............. *H05K 7/06* (2013.01); *H01R 13/502* (2013.01); *H02G 3/16* (2013.01); *H05K 1/181* (2013.01); *H05K 7/026* (2013.01); *H05K 1/182* (2013.01)

(58) Field of Classification Search
CPC .......... H02G 3/16; H05K 1/181; H05K 1/182; H05K 7/026; H05K 7/06; H01R 12/724; H01R 13/502
See application file for complete search history.

(56) References Cited

U.S. PATENT DOCUMENTS

| | | | | |
|---|---|---|---|---|
| 6,166,909 A | * | 12/2000 | Sumida ............... | B60R 16/0238 174/16.3 |
| 2004/0001319 A1 | * | 1/2004 | Kawakita ............... | H05K 7/026 361/715 |
| 2008/0247133 A1 | * | 10/2008 | Ito ....................... | H01H 50/021 361/730 |

FOREIGN PATENT DOCUMENTS

| | | |
|---|---|---|
| JP | H9-283004 A | 10/1997 |
| JP | 2006-203102 A | 8/2006 |

(Continued)

OTHER PUBLICATIONS

International Search Report, Application No. PCT/JP2021/001598, mailed Apr. 20, 2021. ISA/Japan Patent Office.

*Primary Examiner* — Nathan Milakovich
(74) *Attorney, Agent, or Firm* — Honigman LLP

(57) ABSTRACT

A connector module that is provided with an input port and an output port that are configured to be connected to an external member, and is to be mounted on a substrate, the connector module including: a bus bar that is separated from the substrate and connects a terminal of the input port and a terminal of the output port to each other; and an insulating member that is interposed between the bus bar and the substrate.

20 Claims, 7 Drawing Sheets

(51) Int. Cl.
*H02G 3/16* (2006.01)
*H05K 1/18* (2006.01)
*H05K 7/02* (2006.01)

(56) References Cited

FOREIGN PATENT DOCUMENTS

JP   2009225562 A  * 10/2009
JP   2016-092852 A   5/2016

* cited by examiner

CONNECTOR MODULE AND SUBSTRATE STRUCTURE

CROSS-REFERENCE TO RELATED APPLICATIONS

This application is the U.S. national stage of PCT/JP2021/001598 filed on Jan. 19, 2021, which claims priority of Japanese Patent Application No. JP 2020-014062 filed on Jan. 30, 2020, the contents of which are incorporated herein.

TECHNICAL FIELD

The present disclosure relates to a connector module and a substrate structure.

BACKGROUND

JP H09-283004A discloses that, in an electrical junction box including a box body that is provided with: a plurality of fuse fitting parts into which fuses are to be fitted; a plurality of fusible link fitting parts into which fusible links are to be fitted; and a main fusible link fitting part into which a main fusible link is to be fitted, the fuse fitting parts, the fusible link fitting parts, and the main fusible link fitting part are sequentially arranged on one surface of the box body in this order.

Regarding a circuit through which large currents flow, it is necessary to increase the cross-sectional area of an energizing portion of the circuit in order to suppress an increase in resistance. Therefore, when such an energizing wire is to be formed as a wiring pattern on a mounting surface of a substrate, the area of the energizing wire is increased in a direction along the mounting surface rather than in the thickness direction of the substrate, to secure the cross-sectional area of the energizing wire. However, in such a case, such an energizing wire occupies a large area on the limited mounting surface of the substrate, and there is no choice but to expand the substrate itself, which leads to an increase in the size of a device.

However, such a problem is not considered in JP H09-283004A, and cannot be addressed.

Therefore, the present disclosure aims to provide a compact connector module and substrate structure that can handle large currents.

SUMMARY

A connector module according to an embodiment of the present disclosure is a connector module that is provided with an input port and an output port that are configured to be connected to an external member, and is to be mounted on a substrate, the connector module including: a bus bar that is separated from the substrate and connects a terminal of the input port and a terminal of the output port to each other; and an insulating member that is interposed between the bus bar and the substrate.

A substrate structure according to an embodiment of the present disclosure includes: the above-described connector module; a substrate on which the connector module is mounted; and a circuit element that is provided between the insulating member and the substrate.

Effects of Present Disclosure

According to the present disclosure, it is possible to handle large currents without increasing the size of the substrate, and downsize the connector module and the substrate structure.

DETAILED DESCRIPTION OF PREFERRED EMBODIMENTS

Figure 1:
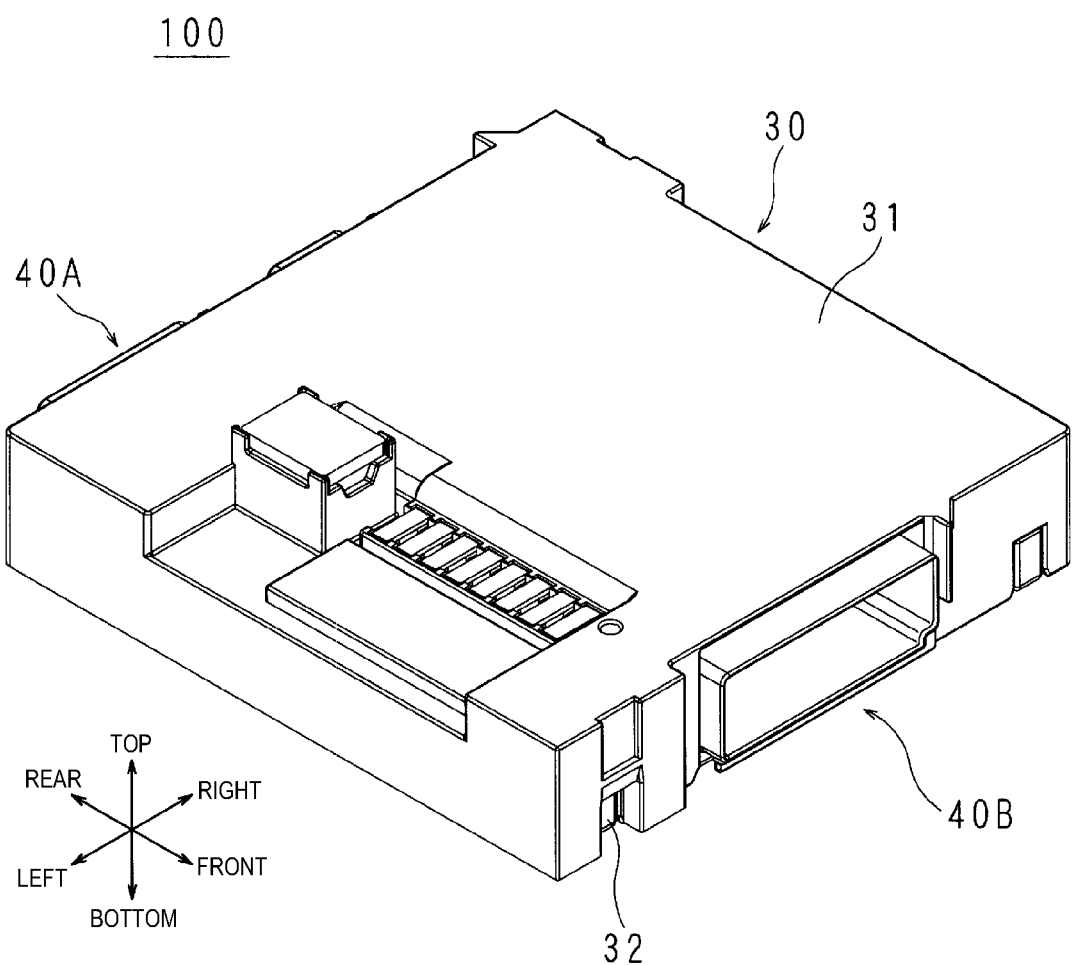
FIG. 1 is a perspective view showing an external appearance of an electrical junction box according to a first embodiment.

First, embodiments of the present disclosure will be listed and described. At least some of the embodiments described below may be combined with each other as appropriate.

First Aspect

A connector module according to a first aspect of the present disclosure is a connector module that is provided with an input port and an output port that are configured to be connected to an external member, and is to be mounted on a substrate, the connector module including: a bus bar that is separated from the substrate and connects a terminal of the input port and a terminal of the output port to each other; and an insulating member that is interposed between the bus bar and the substrate.

According to the first aspect, the bus bar is insulated by the insulating member from the substrate, and is provided above the substrate. Therefore, compared to a case in which the bus bar is provided on the mounting surface of the substrate, a larger number of circuit elements can be mounted on the substrate, and the connector module can be downsized.

Second Aspect

In a connector module according to a second aspect of the present disclosure, the insulating member has a leg that maintains a distance from the substrate.

According to the second aspect, a distance is provided between the insulating member and the substrate. Therefore, it is possible to mount a circuit element or the like on a portion that pertains to the distance in the substrate, and further downsize the connector module.

Third Aspect

In a connector module according to a third aspect of the present disclosure, the bus bar is divided in the middle, and the insulating member is located in the vicinity of two ends of the bus bar that pertain to a dividing point of the bus bar.

In the third aspect, the insulating member is provided at least in the vicinity of two end portions of the bus bar that pertain to the dividing point of the bus bar. Therefore, it is possible to efficiently prevent the end portions of the bus bar from causing a short circuit with the substrate when bending under their own weight, for example.

Fourth Aspect

In the connector module according to a fourth aspect of the present disclosure, the end portions are provided with connection terminals that are configured to be engaged with external fuses.

In the fourth aspect, even if an external force is applied to the connection terminals when the connection terminals provided on the end portions are engaged with external fuses, the insulating member can support the end portions, and efficiently prevent the end portions from causing a short circuit with the substrate.

Fifth Aspect

In a connector module according to a fifth aspect of the present disclosure, the insulating member has a seating recess portion in which the bus bar is mounted.

According to the fifth aspect, the bus bar is mounted in the seating recess portion. Therefore, it is possible to prevent the bus bar from coming loose from the insulating member as much as possible.

Sixth Aspect

A connector module according to a sixth aspect of the present disclosure further includes a fixing claw that fixes the bus bar to the seating recess portion.

According to the sixth aspect, the bus bar is fixed to the seating recess portion by the fixing claw. Therefore, it is possible to reliably prevent the bus bar from coming loose from the insulating member.

Seventh Aspect

A substrate structure according to a seventh aspect of the present disclosure includes: any one of the above-described connector modules; a substrate on which the connector module is mounted; and a circuit element that is provided between the insulating member and the substrate.

According to the seventh aspect, a circuit element is provided on the mounting surface of the substrate, between the substrate and the insulating member. Therefore, it is possible to mount a larger number of circuit elements on the substrate, and downsize the substrate structure.

Hereinafter, a connector module and a substrate structure according to embodiments of the present disclosure will be described with reference to the drawings. Note that the present disclosure is not limited to these examples, but is indicated by the scope of claims, and is intended to include all modifications made within the meaning and scope equivalent to the scope of claims.

First Embodiment

FIG. 1 is a perspective view showing an external appearance of an electrical junction box 100 according to a first embodiment. The electrical junction box 100 is a junction box for vehicles to which fuse elements are attached.

In the present embodiment, for the sake of convenience, the "front", "rear", "left", "right", "top", and "bottom" of the electrical junction box 100 are defined based on the front-rear, left-right, and top-bottom directions shown in FIG. 1. The following descriptions are based on the front-rear, left-right, and top-bottom directions thus defined.

The electrical junction box 100 is provided with a case member 30 for housing a substrate structure 20, which will be described later, and the case member 30 includes an upper case portion 31 and a lower case portion 32. The substrate structure 20 is attached to the lower case portion 32, and the upper case portion 31 covers the lower case portion 32.

Figure 2:
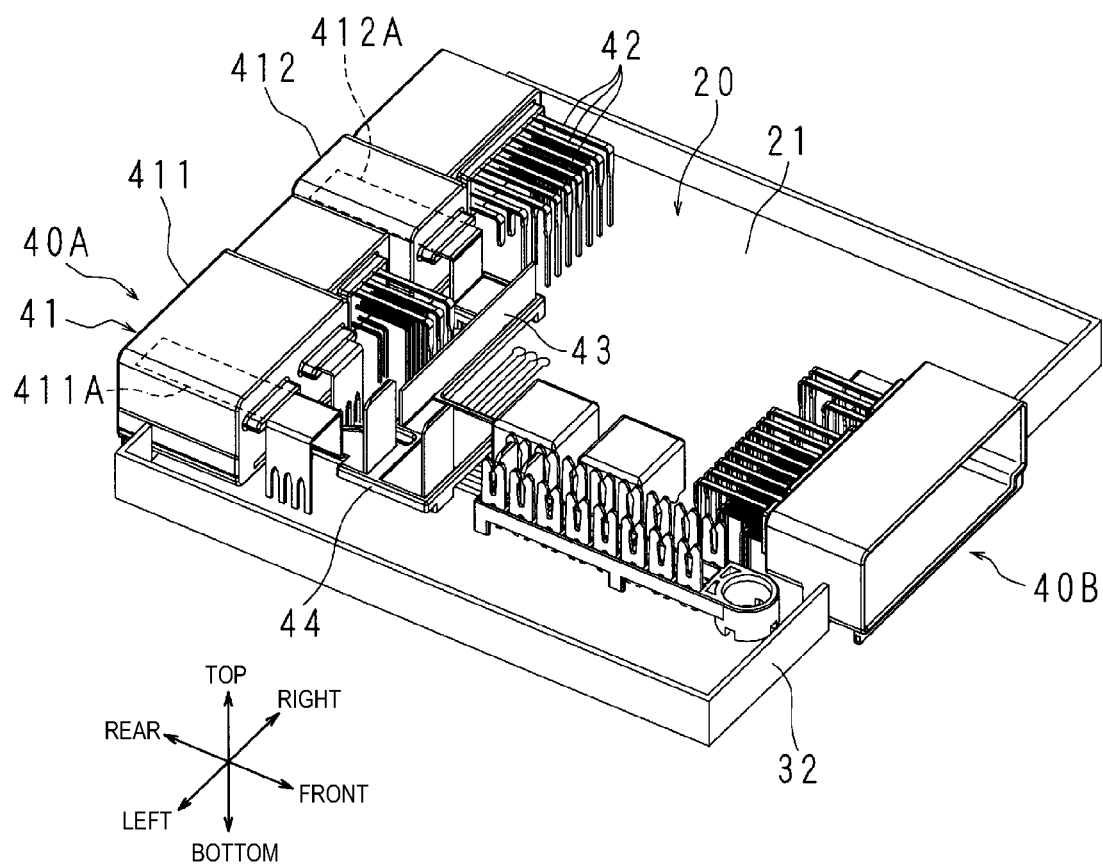
FIG. 2 is a perspective view showing the electrical junction box according to the first embodiment from which an upper case portion is removed.
Figure 3:
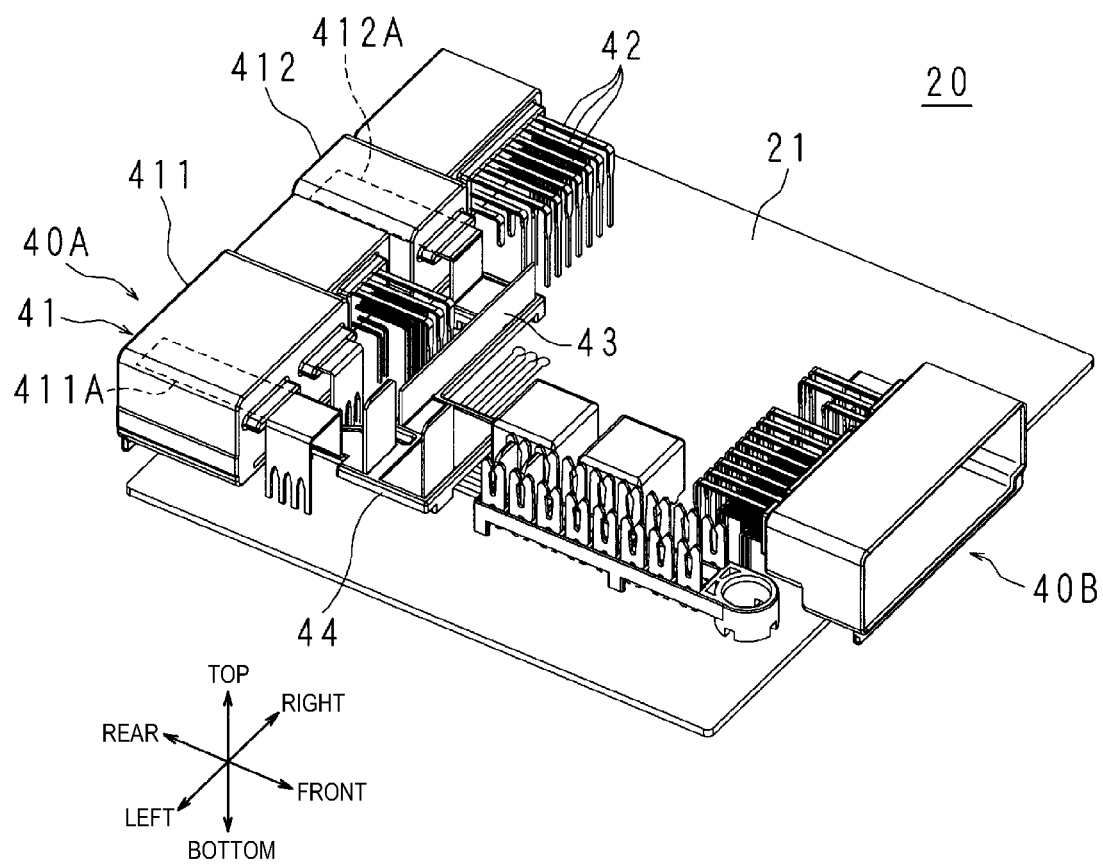
FIG. 3 is a perspective view showing a substrate structure according to the first embodiment.

FIG. 2 is a perspective view showing the electrical junction box 100 according to the first embodiment from which the upper case portion 31 is removed, and FIG. 3 is a perspective view showing the substrate structure 20 according to the first embodiment. The lower case portion 32 includes a rectangular bottom plate and side plates that stand vertically from the edges of the bottom plate. The substrate structure 20 according to the first embodiment is attached to the bottom plate.

The substrate structure 20 includes a substrate 21 that covers substantially the entire surface of the bottom plate of the lower case portion 32, and circuit components that are mounted on the upper surface of the substrate 21. On the upper surface of the substrate 21, a connector module 40A is provided at a rear edge, and a connector module 40B is provided at a front edge. The connector modules 40A and 40B respectively protrude to the outside of the case member 30 through the side plates of the lower case portion 32.

The connector module 40A includes a housing 41, and the housing 41 has a substantially rectangular parallelepiped shape whose lengthwise direction coincides with the left-right direction. A connection terminal 42 that is bent in an L shape is provided on the front side of the housing 41. One end of the connection terminal 42 is connected to the housing 41, and the other end is connected to the substrate 21.

An input port 411 and an output port 412 that are configured to be connected to an external device are provided on the rear surface of the housing 41. That is to say, external terminals are to be connected to the input port 411 and the output port 412.

A bus bar 43 that electrically connects a terminal 411A of the input port 411 and a terminal 412A of the output port 412 to each other is provided on the front side of the housing 41. The bus bar 43 is formed from a conductive metal plate. One end of the bus bar 43 is connected to the input port 411 via the front plate of the housing 41, and the other end is connected to the output port 412 via the front plate of the housing 41. The bus bar 43 is separated upward from the substrate 21.

Figure 4:
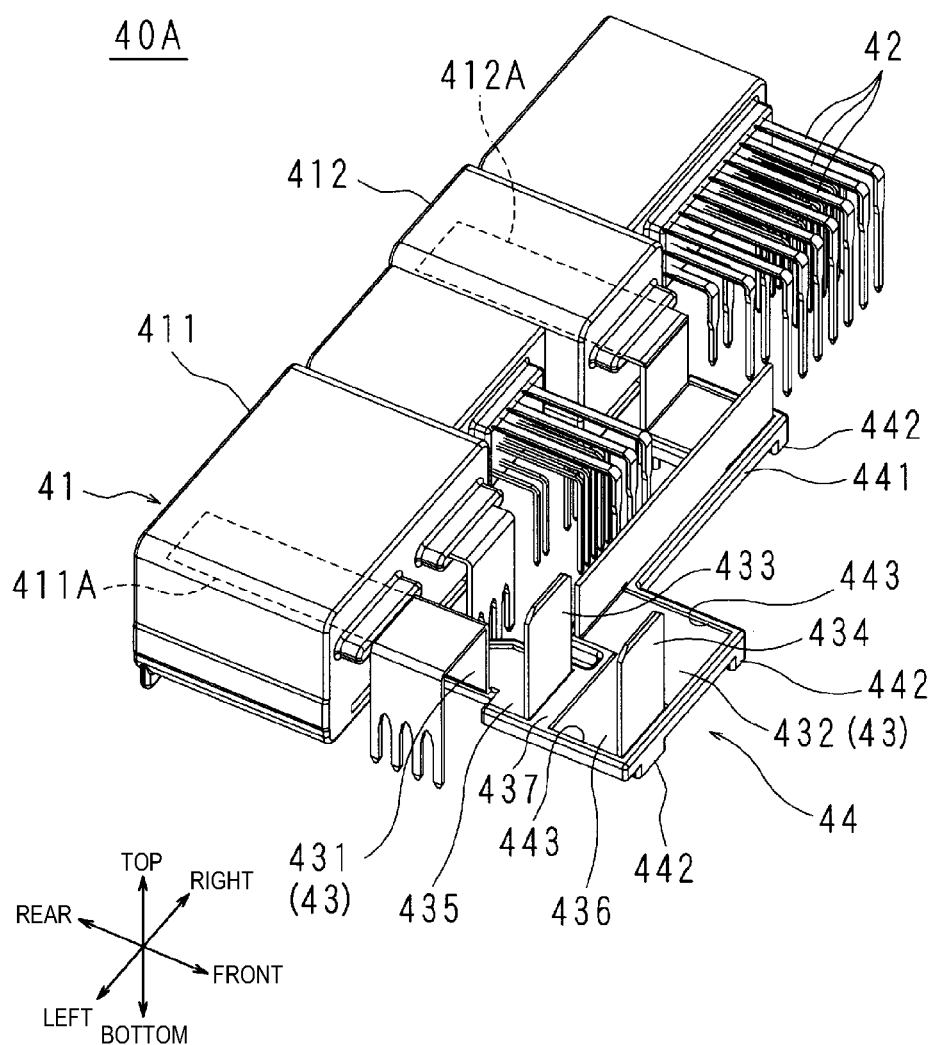
FIG. 4 is a perspective view showing a connector module according to the first embodiment.
Figure 5:
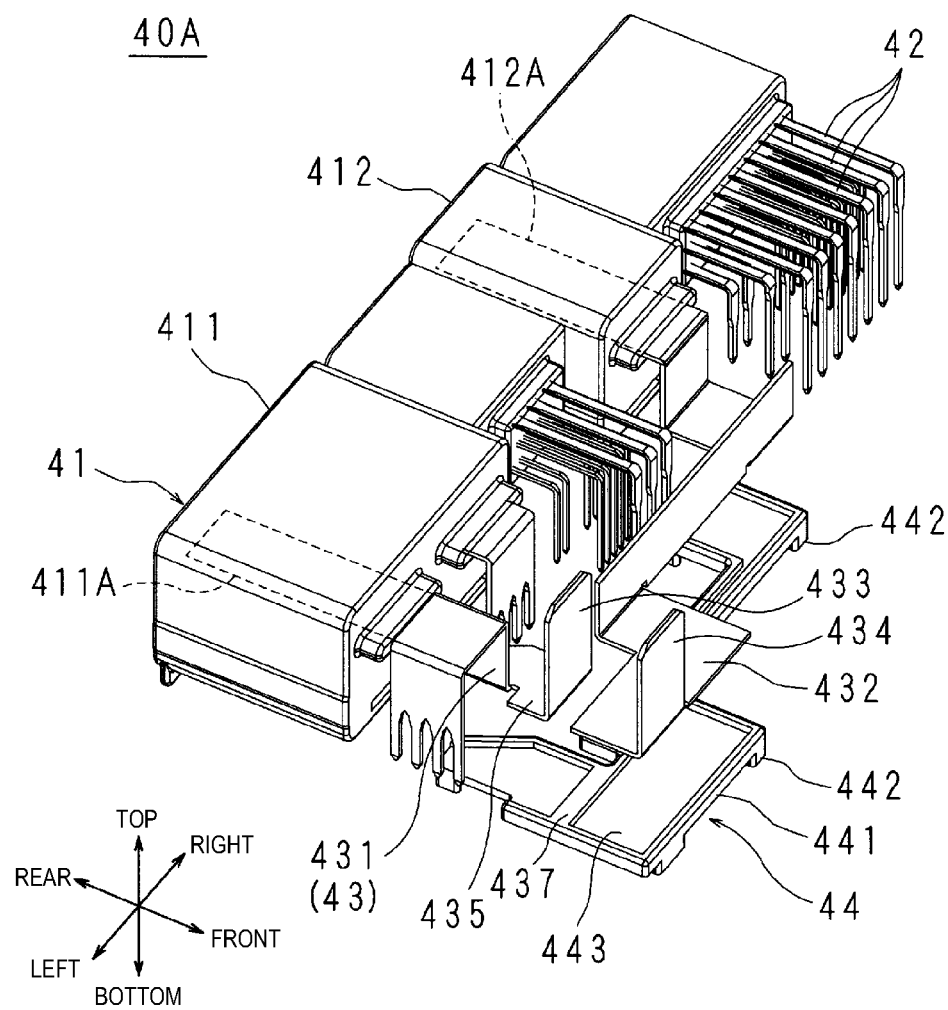
FIG. 5 is a partial exploded view showing the connector module according to the first embodiment.

FIG. 4 is a perspective view showing the connector module 40A according to the first embodiment, and FIG. 5 is a partial exploded view of the connector module 40A according to the first embodiment. The connector module 40A is provided with an insulating member 44 that insulates the bus bar 43 from the substrate 21. For the sake of convenience, FIG. 5 shows a state in which the insulating member 44 is separated from the connector module 40A.

The bus bar 43 is divided at an intermediate position of an energization path that connects the terminal 411A of the input port 411 and the terminal 412A of the output port 412, and is separated into two portions. That is to say, the bus bar 43 is divided into a bus bar piece 431 that is connected to the input port 411, and a bus bar piece 432 that is connected to the output port 412, and the bus bar piece 431 and the bus bar piece 432 are electrically disconnected from each other.

The two ends of the bus bar 43 resulting from the division are provided with terminals 435 and 436 for a fusible link (FL) fuse.

That is to say, of the two portions of the bus bar 43, an end portion 435 of the bus bar piece 431 on the input port 411 side is provided with a terminal 433, and an end portion 436 of the bus bar piece 432 on the output port 412 side is provided with a terminal 434. The end portions 435 and 436 are flat portions that face the substrate 21.

The terminals 433 and 434 are both strip-shaped, and protrude so that the lengthwise direction thereof coincides with the top-bottom direction. The terminals 433 and 434 face each other with a predetermined distance therebetween. That is to say, the terminals 433 and 434 are male terminals, and engage with the female terminals of FL fuses (external fuses) to electrically connect thereto.

As described above, the FL fuses engage (connect) with the terminals 433 and 434, and accordingly the bus bar piece 431 and the bus bar piece 432 are electrically connected to each other. However, when an overcurrent flows through the bus bar 43, the fuse elements of the FL fuses are blown, and thus the bus bar piece 431 and the bus bar piece 432 are electrically insulated from each other.

The insulating member 44 is made of an insulating resin, and insulates the bus bar 43 from the substrate 21. The insulating member 44 is mounted on the mounting surface (the upper surface) of the substrate 21, and is interposed between the bus bar 43 and the substrate 21. The insulating member 44 has an abutting plate 441 that has substantially the same shape as the bus bar 43 in a bottom view, i.e., as the shape of the lower surface thereof. The lower surface of the bus bar 43 abuts against the abutting plate 441 of the insulating member 44.

The abutting plate 441 is provided with a seating recess portion 443 that has a shape that resembles the shape of the lower surface of the bus bar 43. The seating recess portion 443 is a depressed portion, and the bus bar 43 is mounted in the seating recess portion 443. That is to say, the seating recess portion 443 positions the bus bar 43.

As described above, the insulating member 44 has the seating recess portion 443, and the seating recess portion 443 positions the bus bar 43, and therefore work efficiency is improved when the connector module 40A (the substrate structure 20) according to the first embodiment is mounted. Furthermore, the bus bar 43 is mounted in the seating recess portion 443, and therefore the bus bar 43 is prevented from coming loose from the insulating member 44 due to vibration, impact, or the like.

In addition, the seating recess portion 443 is provided with a rib 437 that is located at a position corresponding to the position (hereinafter referred to as the dividing point) at which the bus bar 43 (the bus bar piece 431 and the bus bar piece 432) is divided into the bus bar piece 431 and the bus bar piece 432 when mounted in the seating recess portion 443. The rib 437 has the same width as the distance between the bus bar piece 431 and the bus bar piece 432.

Therefore, the rib 437 suppresses bending or the like, and the shape of the abutting plate 441 is kept unchanged. Also, when the bus bar piece 431 and the bus bar piece 432 are mounted in the seating recess portion 443, the rib 437 is located at the dividing point of the bus bar piece 431 and the bus bar piece 432, and therefore the distance between the bus bar piece 431 and the bus bar piece 432 can be reliably maintained.

Furthermore, the insulating member 44 has a plurality of legs 442 that maintains the distance between the insulating member 44 (the abutting plate 441) and the substrate 21. The legs 442 are provided so as to protrude from a plurality of corners of the lower surface of the abutting plate 441. That is to say, the abutting plate 441 and the substrate 21 face each other, and a gap is provided between the abutting plate 441 and the substrate 21. Therefore, it is possible to more reliably insulate the bus bar 43 from the substrate 21.

Figure 6:
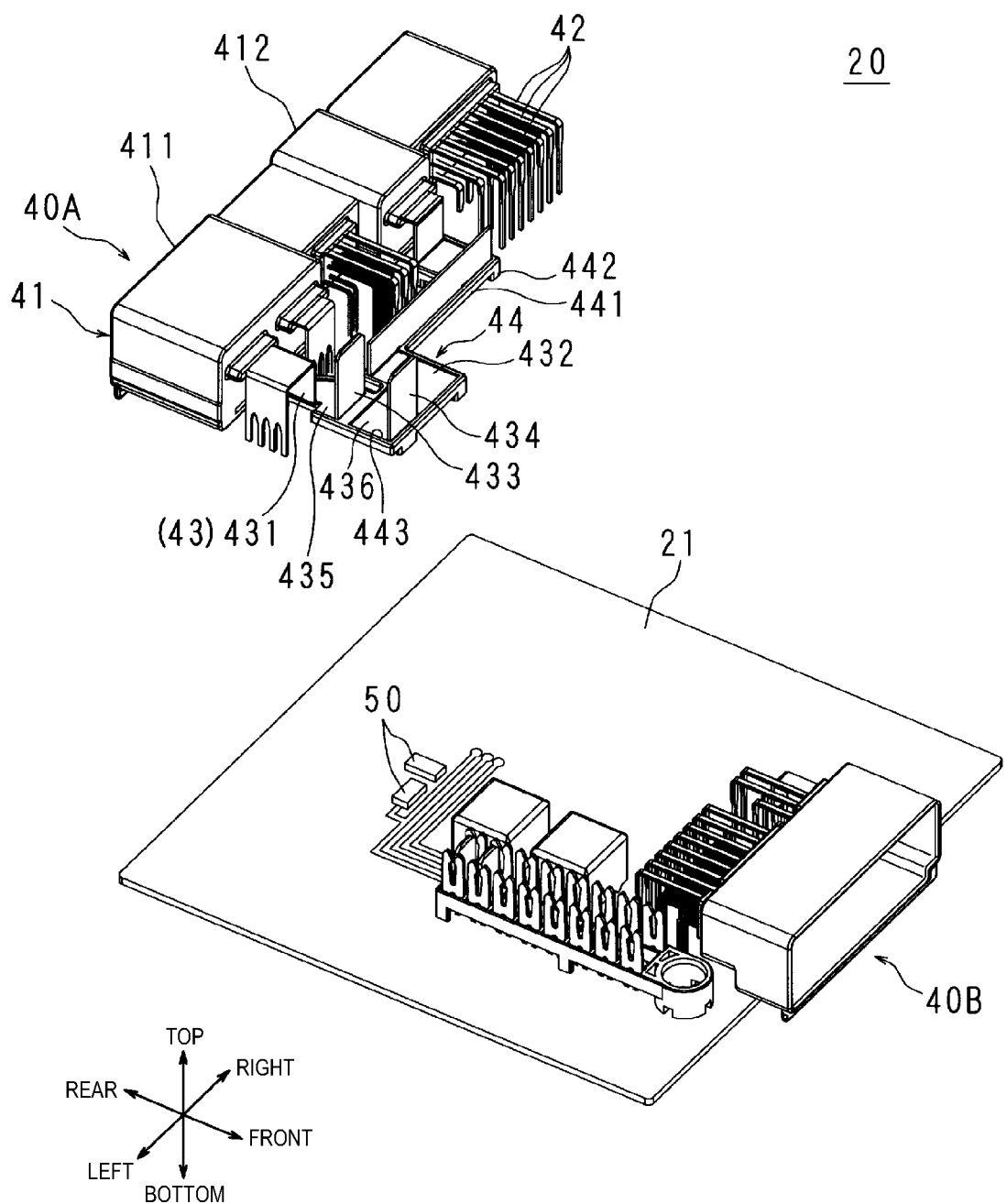
FIG. 6 is an exploded view showing a substrate structure according to the first embodiment.

FIG. 6 is an exploded view of the substrate structure 20 according to the first embodiment. For the sake of convenience, FIG. 6 shows a state in which the connector module 40A is separated from the substrate 21.

As described above, a gap is provided between the abutting plate 441 and the substrate 21 (see FIG. 3). As shown in FIG. 6, circuit elements 50 are mounted on the substrate 21 at positions directly below the abutting plate 441. Note that the circuit elements 50 include a wire-shaped or film-shaped energizing portion.

As described above, in the electrical junction box 100 according to the first embodiment, the bus bar 43, which is an energizing path connecting the terminal 411A of the input port 411 and the terminal 412A of the output port 412, is mounted on the insulating member 44 provided on the substrate 21. That is to say, the circuits are not limited to being formed on the mounting surface of the substrate 21, but are formed three-dimensionally above the mounting surface. Therefore, it is possible to form a larger number of circuits, and downsize the substrate structure 20.

In addition, a circuit element 50 is formed directly below the abutting plate 441 on the substrate 21, using the gap between the abutting plate 441 and the substrate 21. Therefore, it is possible to efficiently downsize the substrate structure 20.

Furthermore, the legs 442 maintain the gap between the abutting plate 441 and the substrate 21. Therefore, the bus bar 43 is prevented from being bent by a force applied to the bus bar 43 when a user inserts FL fuses into the terminals 433 and 434, and causing a short circuit with the circuit elements 50 and so on located below.

Although the above description illustrates an example in which the insulating member 44 is interposed between the bus bar 43 and the substrate 21 in the entire range of the lower surface of the bus bar 43, the present disclosure is not limited to such an example.

It suffices if the insulating member 44 is provided at the dividing point where the bus bar 43 is divided into the bus bar piece 431 and the bus bar piece 432, i.e., in the vicinity of the end portion 435 of the bus bar piece 431 and the end portion 436 of the bus bar piece 432. If this is the case, it is possible to simplify the structure of the insulating member 44, and reduce the weight of the connector module 40A, for example.

Second Embodiment

Figure 7:
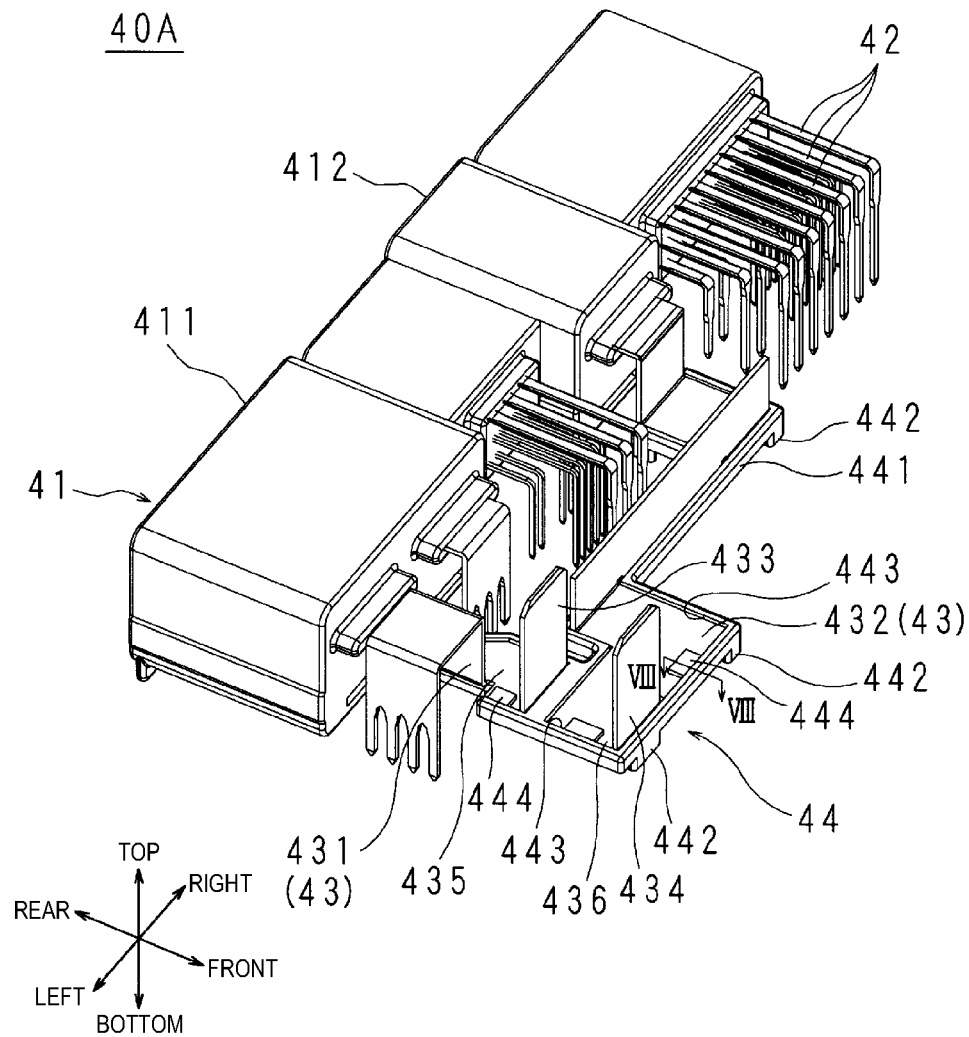
FIG. 7 is a perspective view showing a connector module according to a second embodiment.

FIG. 7 is a perspective view showing a connector module 40A according to a second embodiment.

The connector module 40A according to the second embodiment has substantially the same configuration as that according to the first embodiment, but is different in the configuration of the insulating member 44. The insulating member 44 according to the second embodiment has a plurality of fixing claws 444 that fix the bus bar 43. The following is a description thereof.

Figure 8:
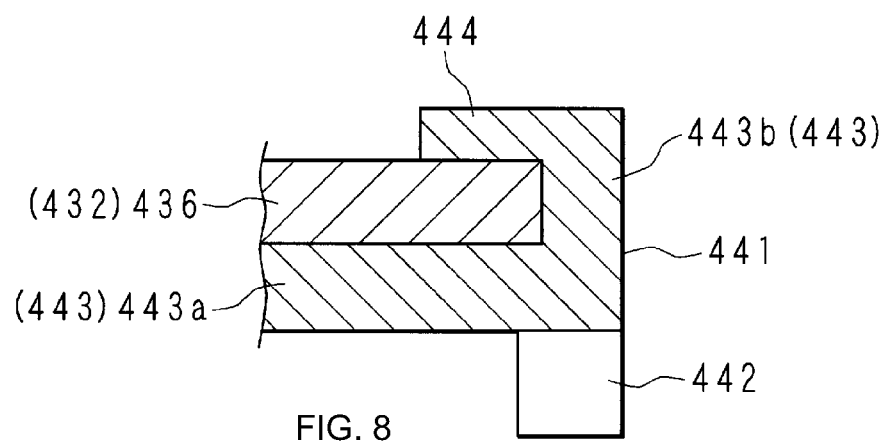
FIG. 8 is a partial cross-sectional view taken along a VIII-VIII line shown in FIG. 7.

As in the first embodiment, the insulating member 44 has the abutting plate 441 that abuts against the lower surface of the bus bar 43, and fixing claws 444 are provided on a particular area of the abutting plate 441. FIG. 8 is a partial cross-sectional view taken along the VIII-VIII line shown in FIG. 7.

The seating recess portion 443 is formed in the abutting plate 441, and the seating recess portion 443 has a bottom plate 443a and side plates 443b that stand vertically from the edges of the bottom plate 443a. The fixing claws 444 are provided so as to extend from the edges of the side plates 443b. The fixing claws 444 each have a rectangular plate shape, and protrude inward from the edges of the side plates 443b in parallel with the bottom plate 443a, for example. The distance between the bottom plate 443a and each fixing claw 444 is substantially the same as the thickness of the end portion 436 of the bus bar piece 432 or the end portion 435 of the bus bar piece 431.

As a result, when mounted in the seating recess portion 443, the end portion 436 and the end portion 435 are interposed between the bottom plate 443a and the fixing claws 444. That is to say, the end portion 436 and the end portion 435 are sandwiched between the bottom plate 443a and the fixing claws 444 from both sides in the thickness direction thereof.

As described above, in the connector module 40A according to the second embodiment, the insulating member 44 is provided with the fixing claws 444, and therefore, when the bus bar 43 is mounted on the insulating member 44 (in the seating recess portion 443), the bus bar 43 is prevented from coming loose from the insulating member 44 due to vibration, impact, or the like.

Components that are the same as those in the first embodiment are given the same reference numerals, and detailed descriptions thereof are omitted.

The embodiments disclosed herein should be considered to be exemplary in all respects and not restrictive. The scope of the present disclosure is indicated by the scope of claims, not by the meaning of the above descriptions, and is intended to include all modifications made within the meaning and scope equivalent to the scope of claims.

The invention claimed is:

1. A connector module that is provided with an input port and an output port that are configured to be connected to an external member, and is to be mounted on a substrate, the connector module comprising:
   a bus bar that is separated from the substrate and connects a terminal of the input port and a terminal of the output port to each other; and
   an insulating member that is interposed between the bus bar and the substrate.

2. The connector module according to claim 1, wherein the insulating member has a leg that maintains a distance from the substrate.

3. The connector module according to claim 2, wherein the bus bar is divided at an intermediate position thereof, and
   the insulating member is located in the vicinity of two ends of the bus bar that pertain to a dividing point of the bus bar.

4. The connector module according to claim 2, wherein the insulating member has a seating recess portion in which the bus bar is mounted.

5. The connector module according to claim 1, wherein the bus bar is divided at an intermediate position thereof, and
   the insulating member is located in the vicinity of two ends of the bus bar that pertain to a dividing point of the bus bar.

6. The connector module according to claim 5, wherein the two ends of the bus bar are provided with connection terminals that are configured to be engaged with external fuses.

7. The connector module according to claim 6, wherein the insulating member has a seating recess portion in which the bus bar is mounted.

8. The connector module according to claim 5, wherein the insulating member has a seating recess portion in which the bus bar is mounted.

9. The connector module according to claim 1, wherein the insulating member has a seating recess portion in which the bus bar is mounted.

10. The connector module according to claim 9, further comprising a fixing claw that fixes the bus bar to the seating recess portion.

11. A substrate structure comprising:
    the connector module according to claim 1;
    a substrate on which the connector module is mounted; and
    a circuit element that is provided between the insulating member and the substrate.

12. The substrate structure according to claim 11, wherein the insulating member has a leg that maintains a distance from the substrate.

13. The substrate structure according to claim 12, wherein the bus bar is divided at an intermediate position thereof, and
    the insulating member is located in the vicinity of two ends of the bus bar that pertain to a dividing point of the bus bar.

14. The substrate structure according to claim 12, wherein the insulating member has a seating recess portion in which the bus bar is mounted.

15. The substrate structure according to claim 11, wherein the bus bar is divided at an intermediate position thereof, and
    the insulating member is located in the vicinity of two ends of the bus bar that pertain to a dividing point of the bus bar.

16. The substrate structure according to claim 15, wherein the two ends of the bus bar are provided with connection terminals that are configured to be engaged with external fuses.

17. The substrate structure according to claim 16, wherein the insulating member has a seating recess portion in which the bus bar is mounted.

18. The substrate structure according to claim 15, wherein the insulating member has a seating recess portion in which the bus bar is mounted.

19. The substrate structure according to claim 11, wherein the insulating member has a seating recess portion in which the bus bar is mounted.

20. The substrate structure according to claim 19, further comprising a fixing claw that fixes the bus bar to the seating recess portion.

* * * * *